United States Patent [19]

Hunt

[11] Patent Number: 4,758,790

[45] Date of Patent: Jul. 19, 1988

[54] ENGINE ANALYSERS FOR CAPACITOR DISCHARGE IGNITION SYSTEMS

[75] Inventor: Christopher J. Hunt, Bridgwater, England

[73] Assignee: FKI Crypton Limited, Somerset, England

[21] Appl. No.: 905,527

[22] Filed: Sep. 10, 1986

[30] Foreign Application Priority Data

Sep. 12, 1985 [GB] United Kingdom ................ 8522600

[51] Int. Cl.[4] ........................ G01R 13/42; F02P 17/00

[52] U.S. Cl. .................................... 324/379; 324/382; 324/390; 324/402; 73/117.3

[58] Field of Search ............... 324/379, 380, 381, 382, 324/388, 389, 390, 391, 392, 402; 73/117.3

[56] References Cited

U.S. PATENT DOCUMENTS

| | | | |
|---|---|---|---|
| 3,576,462 | 4/1971 | Wanninger | 324/379 |
| 3,891,917 | 6/1975 | Harris | 324/382 |
| 4,000,456 | 12/1976 | Johnston et al. | 324/382 X |
| 4,123,674 | 10/1978 | Comiskey et al. | 324/379 X |

*Primary Examiner*—A. D. Pellinen
*Assistant Examiner*—H. L. Williams
*Attorney, Agent, or Firm*—Solon B. Kemon

[57] ABSTRACT

An adaptor for use in conjunction with an internal combustion engine having a capacitor discharge ignition system provides a substitute high voltage pulse coincident with the high tension pulse of the engine ignition system but having a period which is sufficiently prolonged to enable a conventional engine analyzer to be used to measure the usual engine parameters.

6 Claims, 2 Drawing Sheets

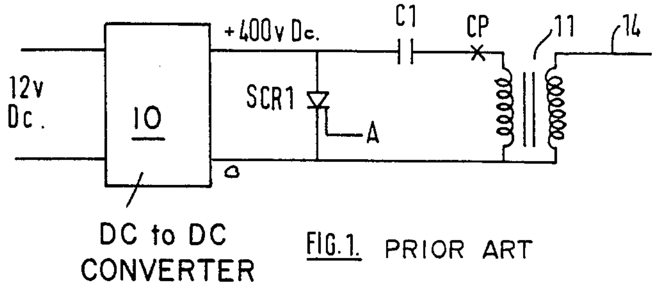
FIG.1. PRIOR ART
FIG.3.
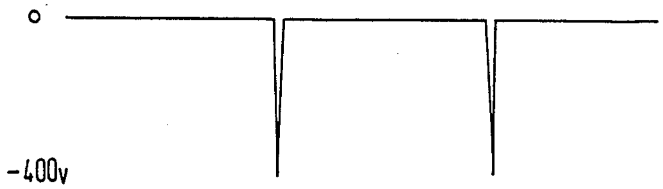
FIG.4.
FIG.5.
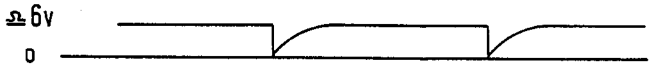
FIG.6.

ENGINE ANALYSERS FOR CAPACITOR DISCHARGE IGNITION SYSTEMS

This invention relates to engine analysers and in particular to means for converting engine analysers for operation with capacitor discharge ingnition systems.

BACKGROUND OF THE INVENTION

With conventional engine analysers, for example of the type disclosed in British Patent Specification No. 1166233, the voltage on the primary of the ignition coil is monitored and used to inhibit the igniton pulse on a specified cylinder, so that the performance of each individual cylinder can be analysed.

With conventional inductive discharge ignition systems the rise time of the ignition pulse is typically of the order of 20 μs. It is consequently possible, upon sensing the pulse on the primary of the ignition coil, to short out the ignition device and inhibit the spark on that cylinder.

With capacitor discharge ignition systems, the rise time of the ignition pulse is only of the order of 2 μs. With a conventional engine analyser it is not possible to inhibit such a pulse before the ignition device is fired.

SUMMARY OF THE INVENTION

According to one aspect of the present invention an adaptor for interfacing an engine analyser with a capacitor discharge ingition system (as herein defined) said adapter comprises: means for detecting a pulse on the primary of the coil of the ignition system, means for producing a coincident pulse of increased rise time and a coil; the coil of the adaptor being such as to produce when said coincident pulse is applied to the primary thereof, an ignition pulse the rise time of which is of sufficient length to permit normal diagnosis to be carried out by the engine analyser.

Preferably the rise time of the ignition pulse produced by the coil of the adaptor will be increased to something of the order of 20 μs.

BRIEF DESCRIPTION OF THE DRAWINGS

An embodiment of the invention is now described, by way of example only, with reference to the accompanying drawings, in which;

FIG. 1 illustrates a typical capacitor discharge ignition system;

FIGS. 3 to 6 show the signals at various points in the circuit illustrated in FIG. 2.

DESCRIPTION OF A PREFERRED EMBODIMENT

Figure 2:
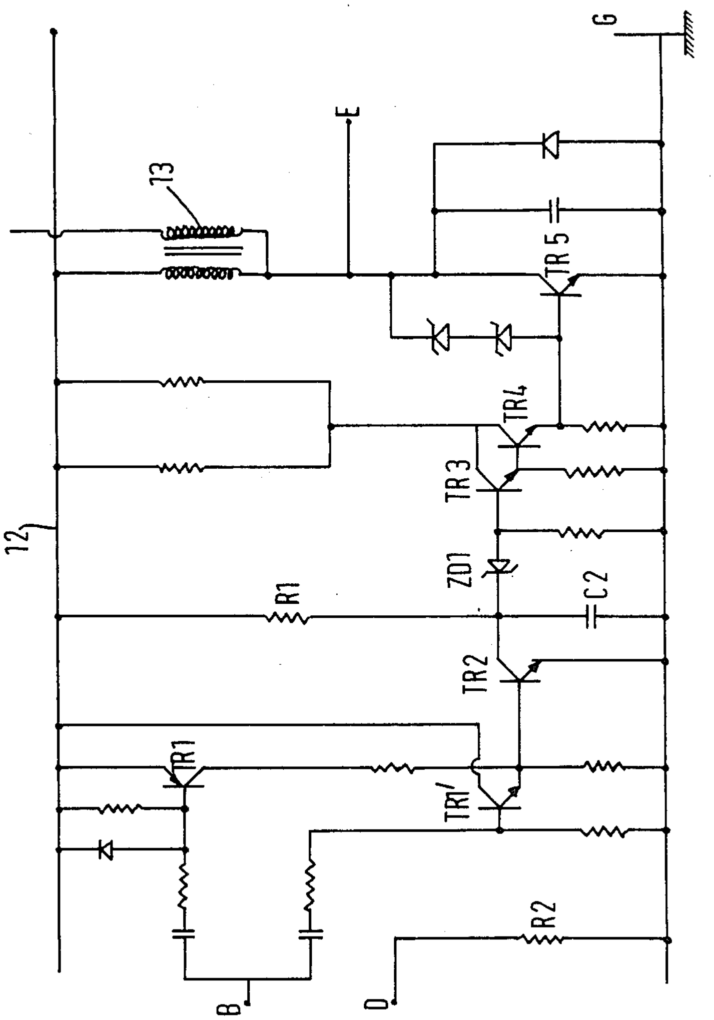
FIG. 2 illustrates an adaptor according to the present invention.

As illustrated in FIG. 1, a typical capacitor discharge ignition system comprises a DC to DC converter 10, which converts the 12 volt DC supply of the vehicle to something of the order of 400 volts DC. This 400 volts charges the capacitor C1 to 400 volts through the primary of coil 11. The silicon control rectifier SCR1 is triggered at point A by an electric pulse when an ignition pulse is required. Triggering of the silicon control rectifier SCR1 causes a −400 volt pulse to be applied to the primary of coil 11 and this induces an ignition pulse in the secondary of the coil, which is connected to a conventional distributor.

This ignition system is such as to provide on the coil secondary, a voltage pulse sufficient in amplitude to break down the rotor gap and the spark plug gap. The coil 11 has a low secondary output impedance and the ignition pulse has a short rise time (about 2 μs), so that an adequate spark will be obtained even with fouled plugs.

The low impedance and short rise time makes conventional engine analyser ignition pulse inhibit circuits ineffective under all engine conditions.

The adaptor illustrated in FIG. 2 is connected at point B to the coil primary of the ignition circuit, point CP in FIG. 1. When a voltage pulse of −400 volts occurs at point CP, this pulse will turn on transistor TR1 which in turn connects the base of transistor TR2 to a 12 volt supply line 12, to turn on transistor TR2.

Capacitor C2 is charged through resistance R1 to a voltage equal to the sum of the base-emitter voltage drops of transistors TR3, TR4 and TR5 plus the break down voltage of zener diode ZD1, when transistors TR3, TR4 and TR5 will be turned on.

When transistor TR2 is turned on, capacitor C2 is discharged so that the voltage on the collector of transistor TR2 falls below the break down voltage of zener diode ZD1 and transistors TR3, TR4 and TR5 are turned off. Coil 13 the produces an ignition pulse by back EMF action, transistors TR3, TR4 and TR5 and coil 13 acting as an inductive ignition system.

FIGS. 3 to 6 show the signals at point B, the collector of transistor TR1, the collector of transistor TR2 and the collector of transistor TR5 respectively.

The secondary coil 13 is connected to the distributor of the vehicle ignition system, while the lead 14 from the secondary of the ignition coil 11 is connected through load resistance R2 to ground, via point D.

The engine analyser is then connected with its coil negative lead to point E on the adaptor and its ground lead to the adapter ground G. The engine analyser may then be used in conventional manner to perform cranking, power balance and other engine performance related tests, utilizing the signal on the primary of coil 13 for ignition pulse inhibit purposes. Also the shape of the signal may be used to provide information about the condition of the ignition leads.

Where the polarity of the pulse at point CP of the ignition circuit is positive rather than negative, the pulse will turn on transistor TR1' rather than TR1. This will then turn on transistor TR2 so that the adaptor will function in the manner described above.

Various modifications may be made without departing from the invention. For example other circuits that will provide a coincident pulse with the required characteristics may be used. Also instead of having a separate adaptor, the adaptor may be built into the engine analyser.

I claim:

1. An adaptor for interfacing an engine analyser to a capacitor discharge ignition system, said adaptor comprising means for detecting a pulse on the primary of the coil of the ignition system, means for producing a coincident pulse of increased rise time and a coil; the coil of the adaptor being such as to produce, when said coincident pulse is applied to the primary thereof, an ignition pulse the rise time of which is of sufficient length to permit normal diagnosis of various parameters of the engine to be carried out by the engine analyser.

2. An adaptor according to claim 1 in which the rise time of the ignition pulse produced by the coil of the adaptor, is of the order of 20 $\mu$s.

3. An adaptor according to claim 1 in which said means for detecting the pulse on the primary of the coil of the ignition circuit wil detect pulses of either polarity.

4. An adaptor according to claim 1 in which said adaptor includes means affording connection to the primary of a coil of an ignition circuit and switch means which is switched on by and for the duration of an electrical pulse in the ignition circuit corresponding to the generation of an ignition pulse in that circuit.

5. An adaptor according to claim 4 in which a capacitor is connected in parallel with said switching means so that the capacitor will be charged when said switching means is switched off and will discharge through the switching means when the switching means is switched on, said capacitor being connected to further switching means such that when the capacitor is charged it will switch said further switching means to connect the primary of the coil of the adaptor to a voltage source and when said capacitor is discharged, it will switch said further switching means to disconnect the primary of the coil of the adaptor from the voltage source and induce an induction pulse in the secondary winding of the coil of the adaptor.

6. An adaptor according to claim 1 in which the secondary winding of the coil of the adaptor is arranged to be connected to the distributor of the ignition system and a connection is provided to the primary of the coil of the adaptor for connection to an engine analyser.

* * * * *